United States Patent [19]

Done

[11] Patent Number: 4,595,177
[45] Date of Patent: Jun. 17, 1986

[54] ROTARY DRUM

[75] Inventor: Kenneth C. W. Done, Swindon, England

[73] Assignee: United Kingdom Atomic Energy Authority, London, England

[21] Appl. No.: 658,707

[22] Filed: Oct. 9, 1984

[30] Foreign Application Priority Data

Oct. 13, 1983 [GB] United Kingdom ............... 8327444

[51] Int. Cl.$^4$ .............................................. B22D 11/00
[52] U.S. Cl. .................................... 266/248; 118/724; 118/730; 164/46; 164/423; 432/251
[58] Field of Search ............... 266/168, 200, 213, 241, 266/248, 287; 118/500, 724, 730; 164/46, 423, 429; 432/251; 165/82

[56] References Cited

U.S. PATENT DOCUMENTS

| 4,251,927 | 2/1981 | Luthi | 432/251 |
| 4,468,281 | 8/1984 | Bender et al. | 164/423 |

FOREIGN PATENT DOCUMENTS

| 25098 | 3/1981 | European Pat. Off. | 164/429 |
| 510396 | 10/1930 | Fed. Rep. of Germany . |
| 1253524 | 11/1967 | Fed. Rep. of Germany . |
| 2381266 | 9/1978 | France . |
| 615733 | 1/1949 | United Kingdom . |
| 1206586 | 9/1970 | United Kingdom . |
| 2065832 | 7/1981 | United Kingdom . |
| 2079324 | 1/1982 | United Kingdom . |

Primary Examiner—L. Dewayne Rutledge
Assistant Examiner—Robert L. McDowell
Attorney, Agent, or Firm—William R. Hinds

[57] ABSTRACT

A rotary drum comprises a hollow cylindrical outer member, a coaxial hub, and a plurality of spokes pivotally connected to the outer member and to the hub, all the spokes being aligned at the same oblique angle to the radius at the respective connections to the hub. Thermal expansion of the outer member relative to the spokes is accommodated by rotation of the outer member relative to the hub and a consequent change in the oblique angle, so minimizing thermally induced stresses in the spokes. The drum may be used in the production of a metal by deposition from the vapor phase onto the outer surface of the drum.

7 Claims, 3 Drawing Figures

ROTARY DRUM

This invention relates to rotary drums and more particularly but not exclusively to rotary drums likely to be exposed in use to temperatures of several hundred degrees.

Rotary drums in the form of a hollow cylinder with radial spoke members connected between the cylinder and a hub are well known. Where there is a temperature difference between the cylinder and the spoke members, or where the spoke members are of a material with a different thermal expansivity than that of the cylinder, the spoke members may experience thermally induced stresses. For example, British Patent No. 2 065 832A describes a drum to be exposed to hot gases for paper drying, wherein spokes are fixed to a hub and extend tangentially therefrom to an outer annulus. A temperature difference between spokes and annulus causes the spokes to bend, generating a bending stress in each spoke. The spokes must therefore be flexible, and this imposes a limit on the radial loads they can support.

According to the present invention there is provided a rotary drum comprising a hollow cylindrical outer member, a co-axial hub member, and a plurality of spoke members each pivotally connected to the hub member and pivotally connected to the outer member, each spoke member being aligned at an oblique angle to the radius at the respective pivotal connection to the hub member, and being inclined in the same sense, the arrangement being such that thermal expansion is accommodated by rotation of the outer member relative to the hub member. The hub member may be freely rotatable about a shaft, and a temperature-compensated drive linkage may extend from the shaft to the outer member. Preferably the linkage comprises two pivotally connected non-aligned drive members, the linkage being secured to the shaft and pivotally connected to the outer member, or vice versa.

Thermal expansion of the outer member of the rotary drum of the invention is thus accommodated by rotation of the outer member relative to the hub member with a consequent change in the oblique angle, so minimising the induced stresses in the spoke members.

The invention also provides a method for producing a metal by deposition of vapour of the metal onto a surface wherein the surface is the outer surface of a rotary drum of the invention. The surface might be cooled so as to ensure that the part of the surface exposed to the vapour is cooler than the melting point of the metal, and at a temperature such that the deposited metal has a desired structure.

The invention will now be further described by way of example only and with reference to the accompanying drawings, in which.

Figure 1:
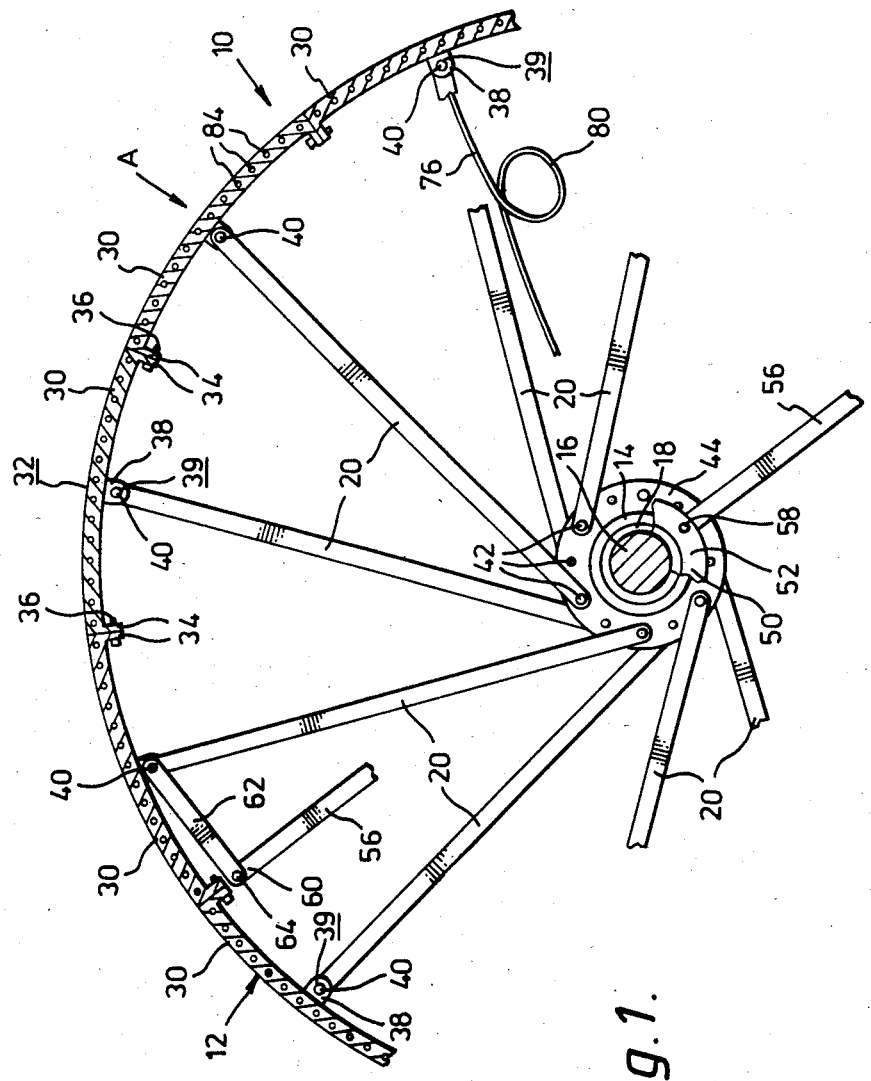
FIG. 1 shows part of a sectional view in a radial plane of a rotary drum.
Figure 2:
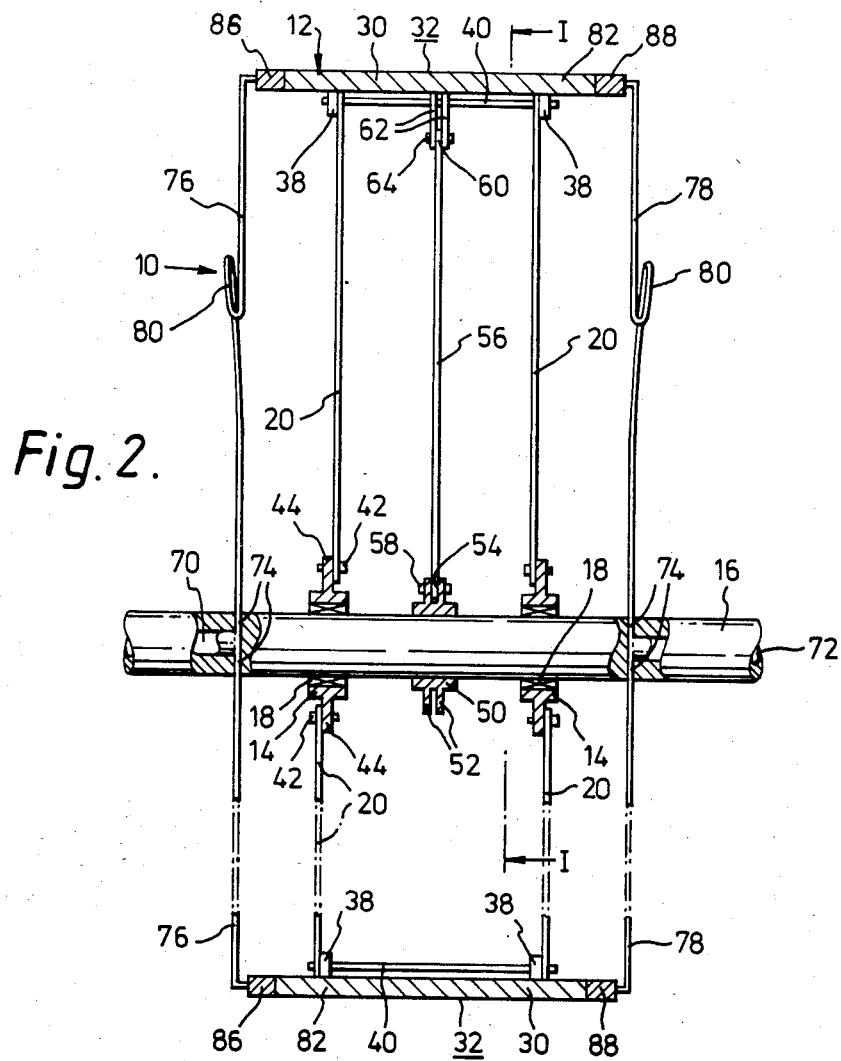
FIG. 2 shows a view on the line II—II of FIG. 1.

Referring to FIGS. 1 and 2, a rotary drum 10 comprises an aluminium outer cylinder 12, and two hubs 14 spaced apart along a shaft 16 and freely rotatable on bearings 18, each hub 14 being connected by twelve stainless steel spokes 20 to the outer cylinder 12 (only eight spokes 20 being shown in FIG. 1). The outer cylinder 12 consists of twelve identical arcuate member 30 (only five being shown in FIG. 1), each with a smooth outer surface 32 and with an inwardly extending flange 34 at each end, adjacent members 30 being joined together by nut and bolt assemblies 36 through the flanges 34.

Extending radially inwards from the centre of each member 30 are two axially displaced lugs 38 defining aligned holes 39 to locate a pivot rod 40. Two spokes 20 are pivotally connected to each member 30 by the respective pivot rod 40, each spoke 20 being adjacent to one of the lugs 38. The radially innermost end of each spoke 20 is pivotally connected by a bolt 42 to a circumferential flange 44 on the respective hub 14, alternate spokes 20 around each hub 14 being attached on opposite sides of the flange 44, and consequently the radially outermost ends of alternate spokes 20 being adjacent to opposite sides of the lugs 38. The bolts 42 are equally spaced around both the flanges 44, lying on pitch circles concentric with the outer cylinder 12, and all twenty four spokes 20 are aligned at the same oblique angle to the respective radius of the pitch circle at the respective bolt 42. At ambient temperatures the oblique angle is about 73°.

Midway between the hubs 14 is a drive hub 50 fixed onto the shaft 16. The drive hub 50 (shown partly broken away in FIG. 1) has two circumferential flanges 52 defining between them a circumferential groove 54. Two driving arms 56 (shown partly broken away in FIG. 1). locate in the groove 54 diametrically opposite each other, being rigidly connected to the drive hub 50 by bolts 58 (only one of which is shown), and extend radially outwards from the drive hub 50 in opposite directions. The radially outermost end 60 of each driving arm 56 is mid-way between two of the pivot rods 40, and is linked to one of the pivot rods 40 by two parallel struts 62 which at one end are pivotally connected by a bolt 64 to the end 60 and at the other end are pivotally connected to the pivot rod 40.

Figure 3:
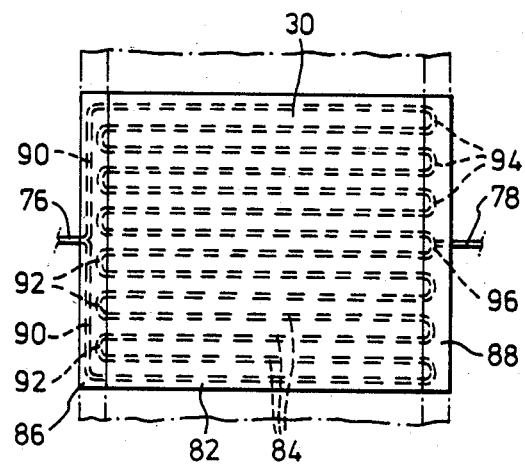
FIG. 3 shows a view in the direction of arrow A of FIG. 1.

The ends of the shaft 16 are hollow and define blind-ended bores 70 and 72 for the inflow and outflow of a coolant liquid. Twelve equally spaced ducts 74 extend radially outwards from each bore 70 or 72 communicating with flexible tubes 76 or 78 connected to opposite sides of each of the arcuate members 30. Each tube 76 and 78 incorporates an expansion loop 80 (only one is shown in FIG. 1) to accommodate slight expansion or rotation of the outer cylinder 12 with respect to the shaft 16. Referring also to FIG. 3, each member 30 has a central portion 82 through which are defined a large member (double an odd number) of parallel ducts 84 extending parallel to the axis of rotation, an inlet manifold portion 86 to which the tube 76 connects, and an outlet manifold portion 88 to which the tube 78 connects. As shown diagrammatically in FIG. 3, two ducts 90 within the inlet manifold portion 86 connect the tube 76 to the outermost ducts 84, and ducts 92 connect alternate pairs of the other ducts 84. Within the outlet manifold portion 88, ducts 94 connect alternate pairs of the ducts 84, and a duct 96 connects the central pair of ducts 84 to the tube 78, so ensuring the coolant liquid follows a zig-zag path through the ducts 84 before emerging into the tube 78. The rotary drum 10 may be used for example in the production of aluminium or an aluminium alloy by the deposition of the vapour of the metal within an evacuated enclosure (not shown), from a crucible (not shown) of molten metal, onto the smooth outer surface 32 of the arcuate members 30 during rotation of the drum 10. This process is described in British Patent Specification Nos. 1206586 and 2079324 to which reference may be made for further details. In this process the outer surfaces 32 may reach a temperature about 200° C. or more hotter than the spokes 20 and the shaft 16. Thermal expansion of the outer cylinder 12 is accommodated by rotation of the hubs 14 on the shaft 16, so changing the oblique angle each spoke 20 makes with the respective radius of the pitch circle at the respective bolt 42, both ends of each spoke 20 being freely pivotable. Consequently there is very little stress set up in the spokes 20 or in the outer cylinder 12 in spite of the temperature difference.

The rotary drum 10 is rotated as the vapour is deposited, rotation of the shaft 16 being transmitted to the outer cylinder 12 by the driving arms 56 and the struts 62. Thermal expansion of the outer cylinder 12 is accommodated by a change in the angle between the driving arm 56 and the struts 62. Heat may be removed from the outer cylinder 12 by passage of the coolant liquid under pressure from the inlet bore 70, through the tubes 76 and so through the ducts 84 of each arcuate member 30, and thence through the tubes 78 to the outlet bore 72.

The rotary drum 10 might for example be 3 m in diameter and 1 m long, and a layer of aluminium alloy about 50 mm thick might be deposited onto the surfaces 32. During deposition, the temperature within the crucible might be about 1700° C. while the temperature of the surface onto which deposition is occurring might be maintained at about 250° C. so as to be well below the melting point of the alloy, and so that the alloy is deposited with a desired structure.

It will be understood that for some applications provision for the flow of coolant liquid may not be required. Alternative drives may also be used, for example the driving arms 54, drive hub 50 and struts 62 being dispensed with, and the hubs 14 being fixed to the shaft 16 so that rotation of the shaft 16 is transmitted to the outer cylinder 12 by the spokes 20.

I claim:

1. A rotary drum comprising a hollow cylindrical outer member, a co-axial hub member, and a plurality of spoke members each pivotally connected to the hub member and pivotally connected to the outer member, each spoke member being aligned at an oblique angle to the radius at the respective pivotal connection to the hub member, and each spoke member being inclined in the same sense relative to the radius at the respective pivotal connection, the arrangement being such that thermal expansion is accommodated by rotation of the outer member relative to the hub member.

2. A rotary drum as claimed in claim 1 wherein the hub member is freely rotatable about a shaft, and a drive linkage extends from the shaft to the outer member, said drive linkage including temperature-compensating means for accommodating variations in the radius of the outer member due to temperature changes.

3. A rotary drum as claimed in claim 2 wherein the drive linkage comprises two pivotally connected non-aligned drive members, and the drive linkage is secured to the shaft and pivotally connected to the outer member, or vice versa.

4. A rotary drum as claimed in claim 1 wherein ducts for the passage of a heat transfer fluid therethrough are provided in thermal contact with the outer member of the rotary drum.

5. A rotary drum as claimed in claim 4 wherein the outer member comprises a plurality of arcuate portions, and the ducts provide a zig-zag path for the heat transfer fluid within each arcuate portion.

6. A rotary drum as claimed in claim 1 wherein each spoke member is aligned at the same oblique angle to the radius at the respective pivotal connection to the hub member.

7. A rotary drum as claimed in claim 1 wherein the oblique angle is about 73° at ambient temperatures.

* * * * *